United States Patent
Chang et al.

(10) Patent No.: US 7,274,513 B2
(45) Date of Patent: Sep. 25, 2007

(54) OFF-AXIS PROJECTION OPTICS AND EXTREME ULTRAVIOLET LITHOGRAPHY APPARATUS EMPLOYING THE SAME

(75) Inventors: Seung-Hyuk Chang, Seongnam-si (KR); I-Hun Song, Seongnam-si (KR); Won-Joo Kim, Suwon-si (KR); Suk-Pil Kim, Yongin-si (KR); Hoon Kim, Siheung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/358,074

(22) Filed: Feb. 22, 2006

(65) Prior Publication Data

US 2006/0188822 A1 Aug. 24, 2006

(30) Foreign Application Priority Data

Feb. 23, 2005 (KR) .............. 10-2005-0015051

(51) Int. Cl.
*G02B 9/00* (2006.01)
(52) U.S. Cl. .............. 359/649; 359/651
(58) Field of Classification Search ........ 359/649–651, 359/838, 850, 856–861
See application file for complete search history.

(56) References Cited

U.S. PATENT DOCUMENTS

| | | | | |
|---|---|---|---|---|
| 5,063,586 A | * | 11/1991 | Jewell et al. | 378/34 |
| 6,710,917 B2 | * | 3/2004 | Mann et al. | 359/365 |
| 6,860,610 B2 | * | 3/2005 | Terasawa | 359/857 |

* cited by examiner

*Primary Examiner*—Timothy Thompson
*Assistant Examiner*—M. Hasan
(74) *Attorney, Agent, or Firm*—Harness, Dickey & Pierce, P.L.C.

(57) ABSTRACT

Off-axis projection optics that includes first and second mirrors positioned off-axis and sharing a confocal point that are arranged to reduce linear astigmatism. If a distance between an object plane and the first mirror is $l_1$, an incident angle of light coming from the object plane to the first mirror is $i_1$, a distance between the first mirror and the confocal point is $l_1'$, a distance between the confocal point and the second mirror is $l_2$, an incident angle of light coming from the first mirror to the second mirror is $i_2$, and a distance between the second mirror and an image plane is $l_2'$, the off-axis projection optics may satisfy the following equation:

$$\frac{l_1' + l_1}{l_1}\tan i_1 = \frac{l_2' + l_2}{l_2}\tan i_2.$$

9 Claims, 6 Drawing Sheets

ASTIGMATISM

S : ×
T : +

OFF-AXIS PROJECTION OPTICS AND EXTREME ULTRAVIOLET LITHOGRAPHY APPARATUS EMPLOYING THE SAME

PRIORITY STATEMENT

This application claims the benefit of Korean Patent Application No. 10-2005-0015051 filed on Feb. 23, 2005, in the Korean Intellectual Property Office, the entire contents of which is incorporated herein by reference.

BACKGROUND OF THE INVENTION

1. Field of the Invention

Example embodiments of the present invention relate to off-axis projection optics and an extreme ultraviolet (EUV) lithography apparatus employing the same.

2. Description of the Related Art

One conventional exposure technique used for sub-100 nm direct-write photolithography in a semiconductor fabrication process involves using an exposure wavelength in an EUV region. EUV lithography uses EUV with a wavelength shorter than 100 nm, for example, a short wavelength of about 13.5 nm.

In an EUV region, because most materials have high light absorption, a refractive optical element may not be used. Thus, an exposure technique using EUV may require a reflective mask and projection optics including multiple reflective mirrors that may allow EUV light reflected from the reflective mask to proceed toward a wafer. For example, EUV light may be irradiated on a reflective mask disposed within a chamber and light reflected from the reflective mask may be reflected by reflective mirrors in projection optics and then may be incident onto a wafer to form a pattern corresponding to the reflective mask on the wafer.

In EUV lithography requiring projection optics including multiple reflective mirrors as described above, it may be difficult to use on-axis projection optics because EUV light proceeds by reflection.

Conventionally, use of a projection optics employing on-axis optics with mirrors sharing a common optical axis has been proposed. However, the proposed projection optics using on-axis optics requires a large number of mirrors (e.g., 6 mirrors) because an aberration introduced by each mirror is corrected while maintaining an on-axis optical system. This is because a structure using only on-axis optics cannot meet a requirement that an incident EUV beam be symmetrical about a central axis of a mirror in order to reduce aberration from the mirror. Herein, a structure using on-axis optics refers to a structure in which mirrors used correspond to portions of mirrors constituting the on-axis optics.

An increased number of mirrors in conventional projection optics using on-axis optics may increase the manufacturing costs and may reduce overall reflectance. That is, because reflectance in an EUV region is significantly lower than that in a visible light region, an increased number of mirrors may significantly reduce the overall reflectance of projection optics and thereby light utilization efficiency. As is known in the art, an amount of EUV light decreases by about 35% each time the EUV light passes through a mirror. For example, if a number of mirrors used is six and a reflectance of each mirror is 65%, the overall reflectance is about 7% ((0.65$^6$)×100%). That is, only about 7% of the original amount of EUV light remains after it passes through the six mirrors.

SUMMARY OF THE INVENTION

An example embodiment of the present invention provides off-axis projection optics. The off-axis projection optics may be designed and/or arranged to increase overall reflectance when used in extreme ultraviolet lithography (EUVL) by improving aberration characteristics and/or reducing a number of mirrors used in an EUVL apparatus employing the off-axis projection optics.

An example embodiment of the present invention provides off-axis projection optics. The off-axis projection optics may include first and second mirrors positioned off-axis and sharing a confocal point that are arranged to reduce linear astigmatism.

An example embodiment of the present invention provides off-axis projection optics. The off-axis projection optics may include first and second mirrors that are positioned off-axis and share a confocal point, wherein if a distance between an object plane and the first mirror is $l_1$, an incident angle of light coming from the object plane to the first mirror is $i_1$, a distance between the first mirror and the confocal point is $l_1'$, a distance between the confocal point and the second mirror is $l_2$, an incident angle of light coming from the first mirror to the second mirror is $i_2$, and a distance between the second mirror and an image plane is $l_2'$, the first and second mirrors are designed to satisfy the following Equation:

$$\frac{l_1' + l_1}{l_1} \tan i_1 = \frac{l_2' + l_2}{l_2} \tan i_2.$$

An example embodiment of the present invention provides a lithography apparatus. The lithography apparatus may include at least one of the off-axis projection optics of example embodiments of the present invention as described herein.

BRIEF DESCRIPTION OF THE DRAWINGS

Example embodiments of the present invention will be more clearly understood from the detailed description taken in conjunction with the accompanying drawings.

DETAILED DESCRIPTION OF THE INVENTION

Figure 1:
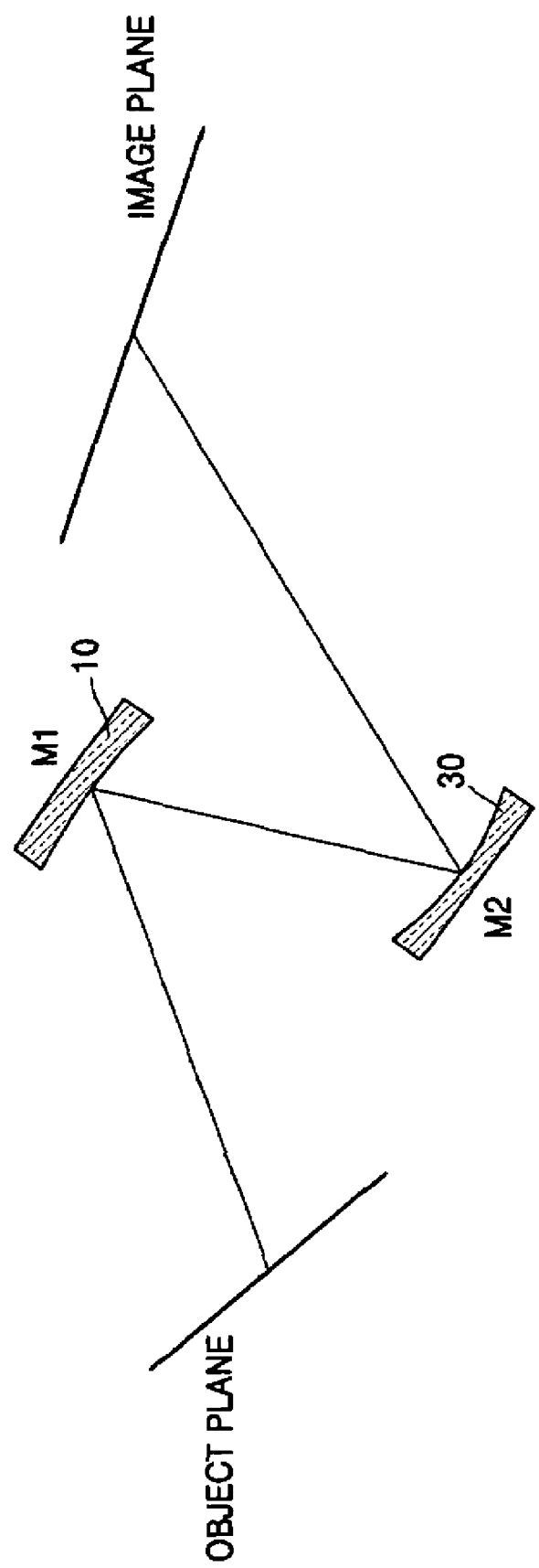
FIG. 1 shows off-axis projection optics according to an example embodiment of the present invention.

Various example embodiments of the present invention will now be described more fully with reference to the accompanying drawings in which some example embodiments of the invention are shown.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Off-axis projection optics suitable for use in extreme ultraviolet lithography (EUVL) according to an example embodiment of the present invention is herein described in detail with reference to the accompanying drawings.

Use of a general off-axis mirror may introduce a large amount of linear astigmatism. Example embodiments of the present invention provide off-axis projection optics with a plurality of mirrors positioned off-axis, which may reduce and/or eliminate linear astigmatism, and thus may achieve an EUV projection optics with a reduced number of mirrors.

Referring to FIG. 1, off-axis projection optics according to an example embodiment of the present invention may include a first mirror (M1) 10 and a second mirror (M2) 30 that may each be positioned off-axis and share a confocal point. Off-axis projection optics according to an example embodiment of the present invention may include at least one pair of first and second mirrors 10 and 30, the specifications and arrangement of which may satisfy Equation (1) shown below. The off-axis projection optics of according to an example embodiment of the present invention may further include a third mirror (not shown). In an example embodiment of the present invention having three mirrors, the specifications and arrangement of the second and third mirrors may substantially correspond to those of the first and second mirrors 10 and 30 shown in FIG. 1.

Figure 2:
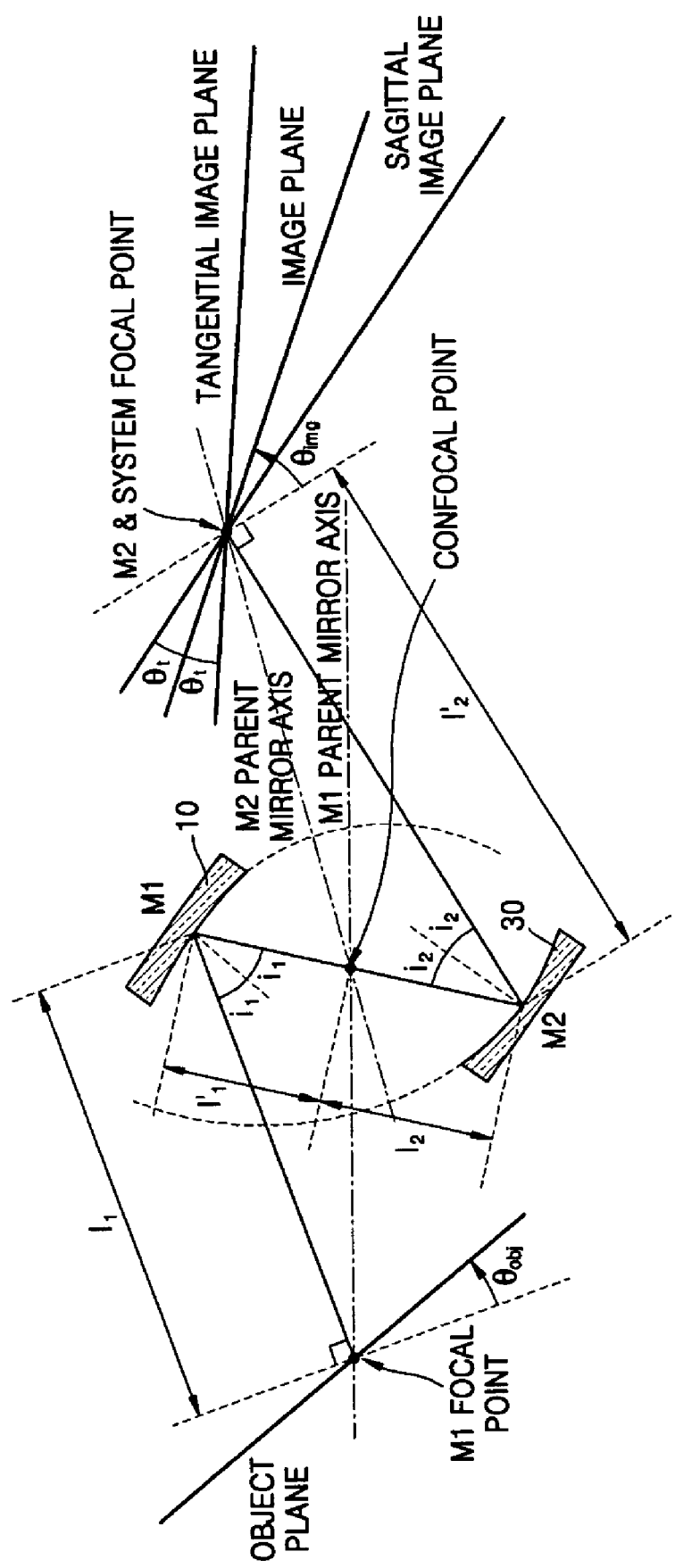
FIG. 2 is an example diagram for explaining a configuration of the off-axis projection optics of FIG. 1 in accordance with an example embodiment of the present invention.

FIG. 2 is an example diagram for explaining a configuration of the off-axis projection optics of FIG. 1 satisfying Equation (1) according to an example embodiment of the present invention. Virtual parent mirrors of first and second mirrors 10 and 30 are indicated by dotted lines in FIG. 2. Hereinafter, parent mirrors of the first and second mirrors 10 and 30 are referred to as first and second parent mirrors, respectively. The first and second mirrors 10 and 30 may be portions of the first and second parent mirrors According to an example embodiment of the present invention, axes of first and second parent mirrors may meet at a confocal point of first and second mirrors 10 and 30 and may form an angle to each other because the first and second mirrors 10 and 30 are positioned off-axis.

According to an example embodiment of the present invention, first and second mirrors 10 and 30 may be designed to satisfy the Equation (1) below. For example, referring to FIG. 2, if a distance between an object plane and a first mirror 10 is $l_1$, an incident angle of light coming from the object plane to the first mirror 10 is $i_1$, a distance between the first mirror 10 and a confocal point is $l_1'$, a distance between the confocal point and a second mirror 30 is $l_2$, an incident angle of light coming from the first mirror 10 to the second mirror 30 is $i_2$, and a distance between the second mirror 30 and an image plane is $l_2'$, the first and second mirrors 10 and 30 may be designed and arranged to satisfy the Equation (1):

$$\frac{l_1' + l_1}{l_1} \tan i_1 = \frac{l_2' + l_2}{l_2} \tan i_2 \qquad (1)$$

If first and second mirrors 10 and 30 are designed to satisfy Equation (1), it is possible to reduce and/or eliminate linear astigmatism that is aberration induced by an off-axis mirror described below with reference to FIGS. 3 and 4.

Figure 3:
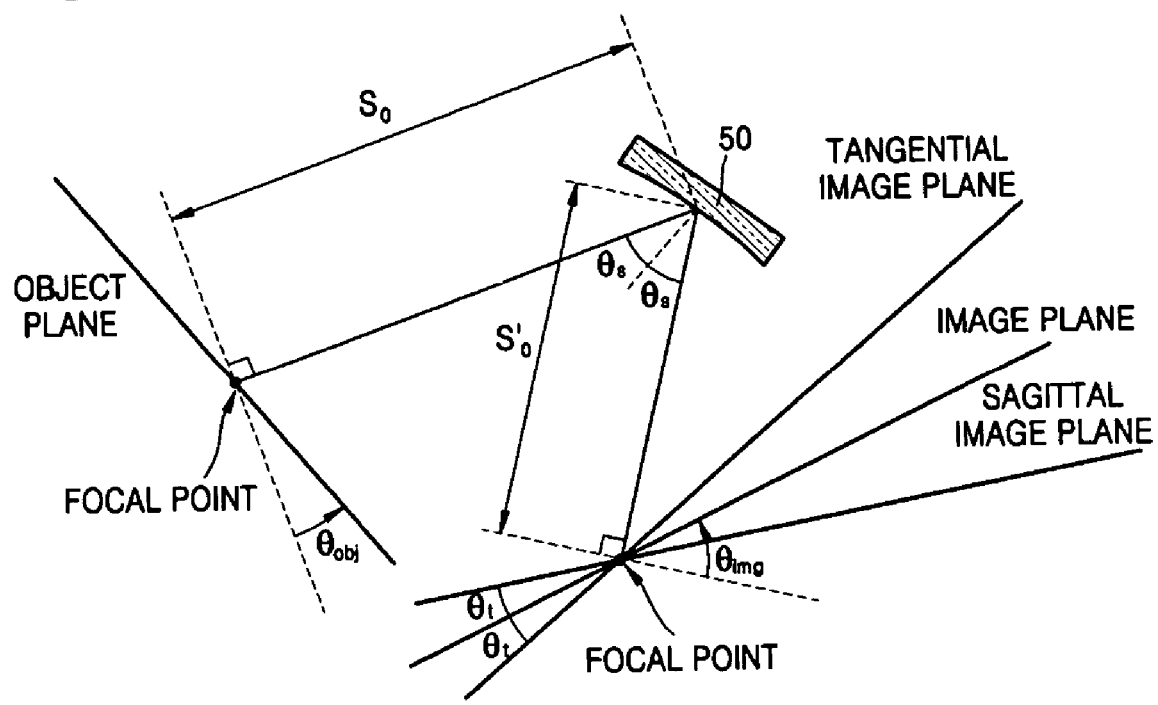
FIG. 3 is a diagram for explaining linear astigmatism introduced by a general off-axis mirror.

FIG. 3 is an example diagram for explaining linear astigmatism introduced by an off-axis mirror 50.

Referring to FIG. 3, if a distance between an object plane and a mirror 50 disposed in an off-axis position is $S_o$, a distance between the mirror 50 and an image plane is $S_o'$, an angle by which the object plane is tilted is $\theta_{obj}$, an angle by which the image plane is tilted is $\theta_{img}$, an amount tan $\theta_{img}$ by which the image plane is titled when the object plane is tilted and the amount tan $\theta_t$ of linear astigmatism are respectively defined by Equations (2) and (3):

$$\tan \theta_{img} = \frac{S_o'}{S_o} an \theta_{obj} \qquad (2)$$

$$\tan \theta_t = \frac{S_o'}{R} \tan 2\theta_s \qquad (3)$$

$\theta_s$ and $\theta_t$ respectively denote an incident angle of light coming from the object plane to the mirror 50 and an angle of tangential image plane and sagittal image plane relative to the image plane. For an on-axis mirror, $\theta_t=0$.

Figure 4:
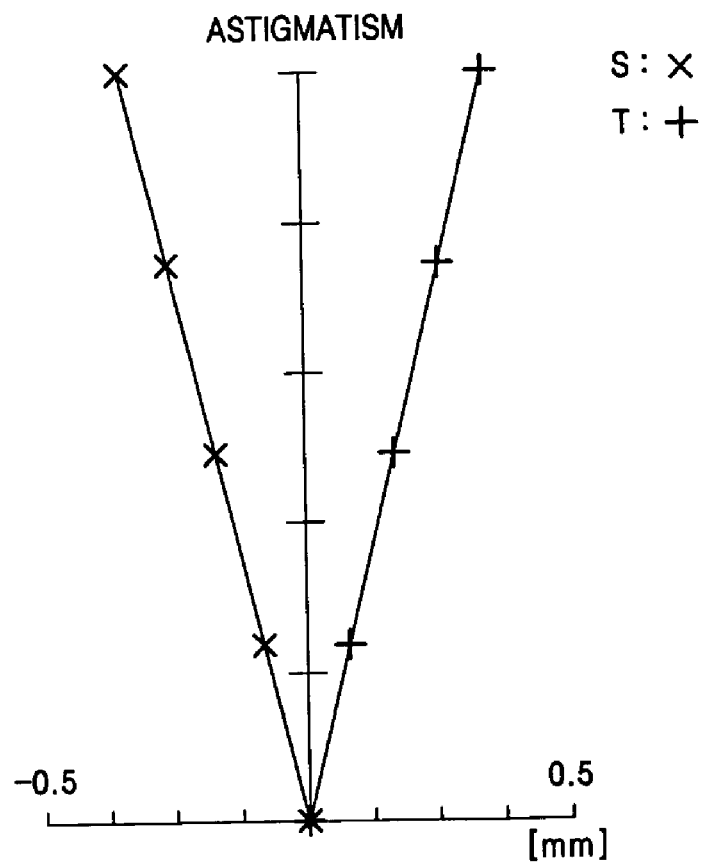
FIG. 4 is a diagram of astigmatism introduced by a general off-axis mirror.

FIG. 4 is an example diagram of astigmatism introduced by an off-axis mirror 50. Referring to FIG. 4, T and S respectively denote a tangential image plane and a sagittal image plane. The vertical axis in FIG. 4 coincides with an image plane calculated by Equation (2) above. As evident from FIG. 4, the slopes of the tangential image plane T and the sagittal image plane S at an original point do not coincide with the vertical axis but are tilted opposite to each other. That is, the feature of linear astigmatism is shown in FIG. 4. In FIG. 4, even though both the tangential image plane T and the sagittal image plane S contain a curvature component (second-order function component) corresponding to astigmatism being induced by an on-axis mirror, the curvature components are not shown because they have a large slope due to linear astigmatism.

The following Table 1 shows an example of a specification for off-axis projection optics according to an example embodiment of the present invention, as shown in FIGS. 1 and 2.

TABLE 1

|  |  |  |
|---|---|---|
|  | $\theta_{obj}$ | 10° |
|  | $\theta_{img}$ | 6.704426230° |
| First mirror (M1) | Conic constant $K_1$ | −0.3002404736 |
|  | $i_1$ | 15° |
|  | Radius of curvature $R_1$ | 139.9519053 mm |
|  | $l_1$ | 300 mm |
|  | $l_1'$ | 100 mm |
| Second mirror (M2) | Conic constant $K_2$ | −0.1588293047 |
|  | $i_2$ | 13.39693421° |
|  | Radius of curvature $R_2$ | 189.2634065 mm |
|  | $l_2$ | 150 mm |
|  | $l_2'$ | 300 mm |

Table 1 shows example design values of first and second mirrors 10 and 30 when an object plane is tilted at 10° and a beam diverging from an object plane as an origin is incident to the first mirror 10.

As described earlier with reference to FIGS. 1 and 2, if a first mirror (M1) 10 and a second mirror (M2) 30 sharing a confocal point are positioned off-axis and are designed and arranged according to the specification shown in Table 1, linear astigmatism may be reduced and/or eliminated in off-axis projection optics according to an example embodiment of the present invention by satisfying Equation (1).

Figure 5:
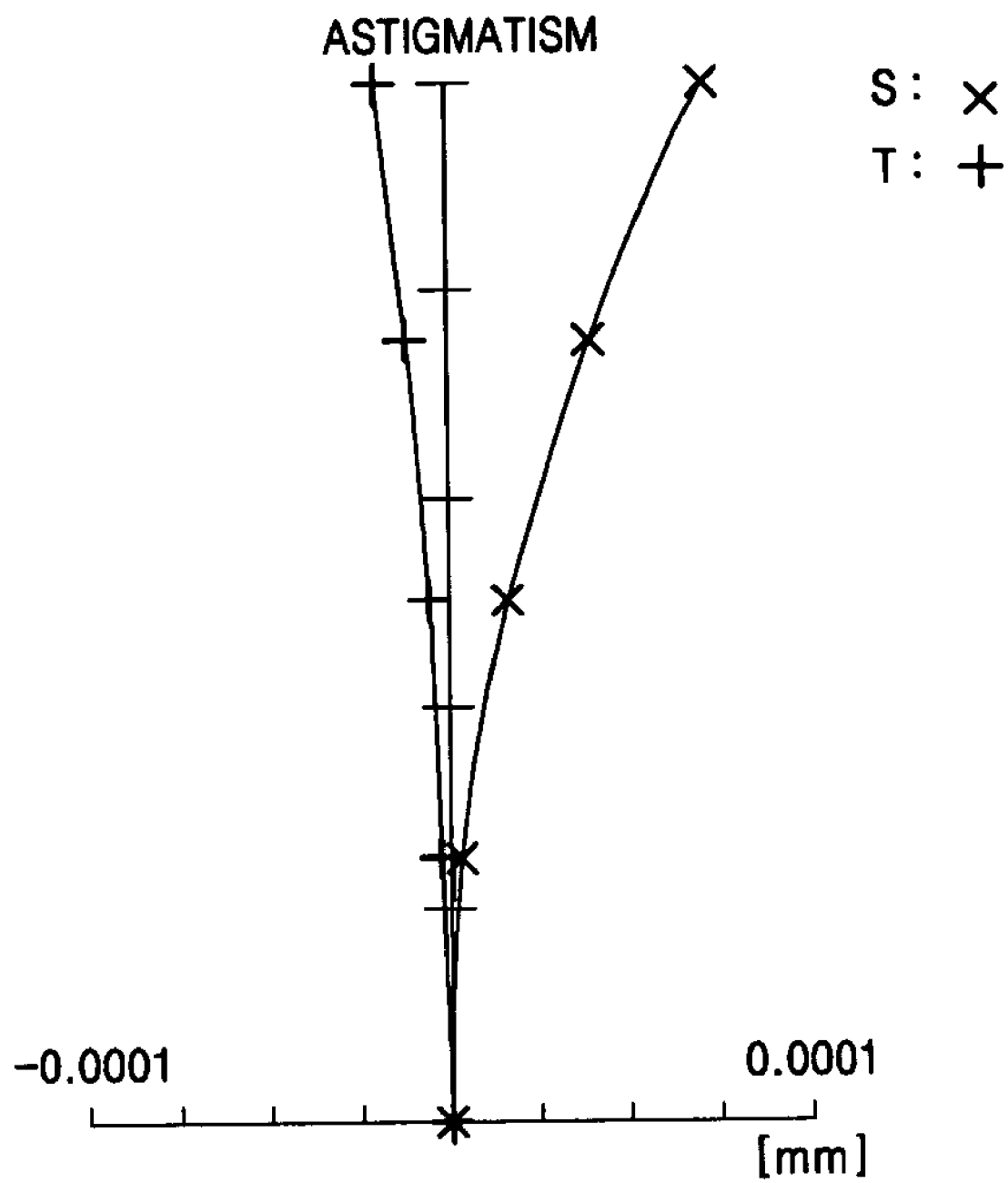
FIG. 5 is a diagram of astigmatism introduced by off-axis projection optics of the present invention designed according to the specifications shown in Table 1.

FIG. 5 is a diagram of astigmatism introduced by off-axis projection optics of an example embodiment of the present invention designed according to the specifications shown in Table 1. T and S respectively denote a tangential image plane and a sagittal image plane. As evident from FIG. 5, because linear astigmatism is reduced and/or eliminated, both a tangential image plane T and a sagittal image plane S contain only curvature components (second-order function components) corresponding to astigmatism induced by an on-axis mirror. That is, while an off-axis mirror 50 of FIG. 4 may suffer a large amount of linear astigmatism, as evident from FIG. 5, off-axis projection optics according to an example embodiment of the present invention with first and second mirrors 10 and 30 designed and arranged according to the specification shown in Table 1 may exhibit characteristics of astigmatism corresponding to that for an on-axis mirror because linear astigmatism may be reduced and/or eliminated.

Figure 6:
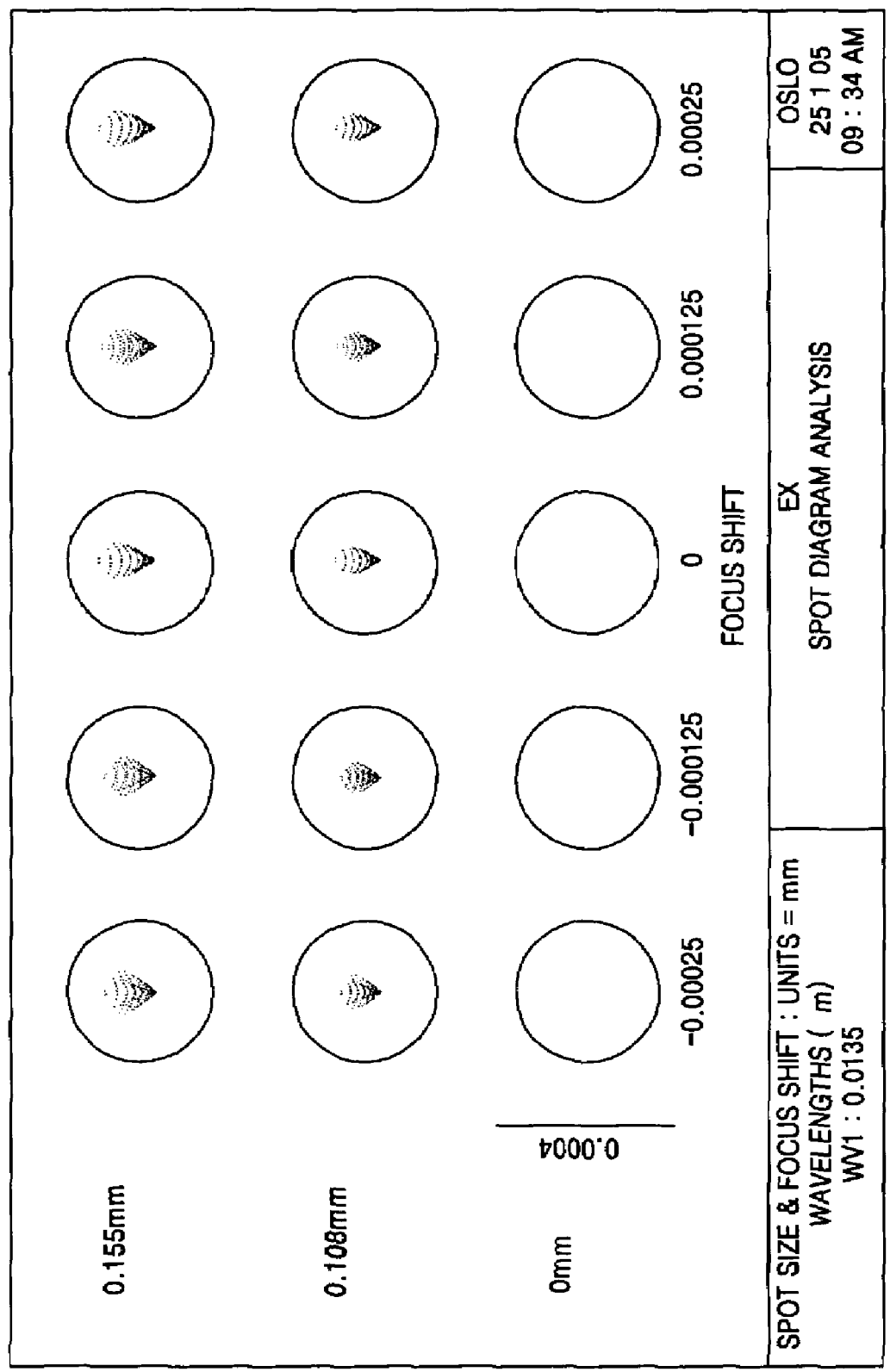
FIG. 6 shows a change in beam spot with respect to a focus shift in the off-axis projection optics with the first and second mirrors designed and arranged as shown in Table 1 according to an example embodiment of the present invention.

FIG. 6 shows a change in beam spot with respect to a focus shift in off-axis projection optics according to an example embodiment of the present invention including first and second mirrors 10 and 30 designed and arranged according to specifications as shown in Table 1. As evident from FIG. 6, off-axis projection optics according to an example embodiment of the present invention with linear astigmatism reduced and/or removed shows mainly coma aberration that may occur in an on-axis optics. As evident from FIGS. 5 and 6, off-axis projection optics according to an example embodiment of the present invention may provide similar aberration performance as an on-axis mirror because linear astigmatism has been reduced and/or removed.

In Table 1, $\theta_{obj}$ is a tilting angle of an object plane relative to a first mirror 10 and $\theta_{img}$ is a tilting angle of an image plane. An image plane with respect to the first mirror 10 may be located at a confocal point. The tilting angle of the image plane relative to the first mirror 10 may correspond to a tilting angle of the object plane relative to a second mirror 30. $l_1$ and $l_1'$ respectively denote a distance between the object plane relative to the first mirror 10 and the first mirror 10 and a distance between the first mirror 10 and the image plane relative to the first mirror 10. $l_2$ and $l_2'$ respectively denote a distance between the object plane relative to the second mirror 30 and the second mirror M2 and a distance between the second mirror 30 and the image plane relative to the second mirror 30.

According to an example embodiment of the present invention, the tilting angle of an image plane relative to a first mirror 10 (the tilting angle of the object plane relative to the second mirror 30) may be calculated by substituting values of $\theta_{obj}$, $l_1$ and $l_1'$ in Table 1 into Equation (2). A tilting angle $\theta_{img}$ of the image plane relative to the second mirror 30 (e.g., an angle at which the image plane is tilted in the off-axis projection optics according to an example embodiment of the present invention) may be obtained by substituting the tilting angle of the image plane relative to the first mirror 10 and values of $l_2$ and $l_2'$ into Equation (2).

Off-axis projection optics according to an example embodiment of the present invention may show substantially the same aberration characteristics as an on-axis optics because a large amount of linear astigmatism generated in a general off-axis optics may be reduced and/or removed. According to an example embodiment of the present invention, a need to increase the number of mirrors to reduce aberration may be reduced and/or eliminated unlike in a conventional projection optics employing on-axis optics. Off-axis projection optics of an example embodiment of the present invention may use a reduced number of mirrors compared to a conventional projection optics, and may achieve increased overall reflectance compared to the conventional projection optics.

Figure 7:
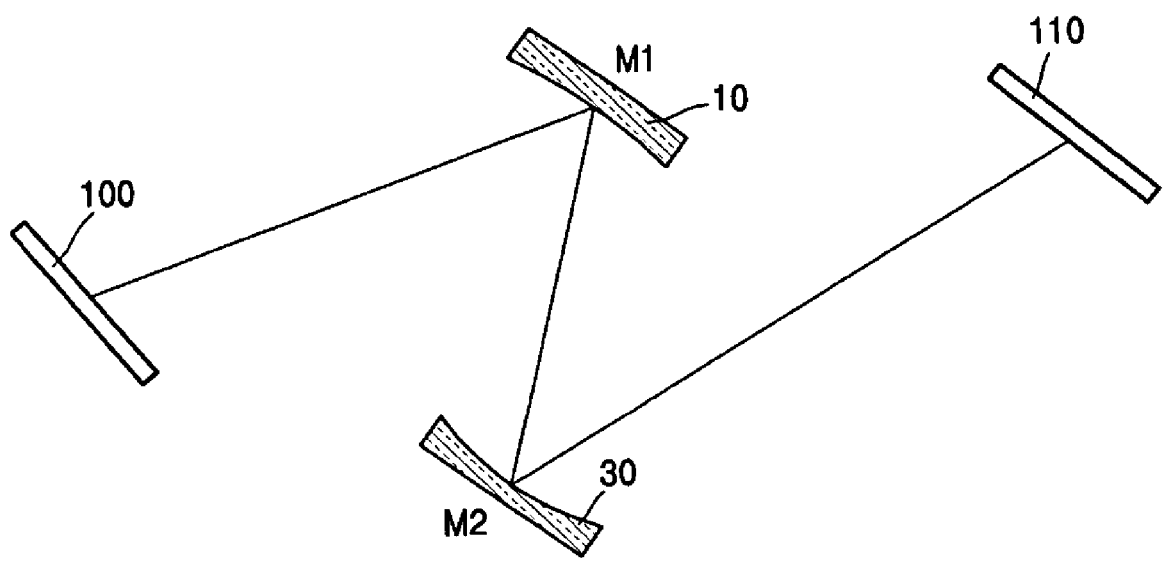
FIG. 7 shows an example of an extreme ultraviolet lithography (EUVL) apparatus using off-axis projection optics according to an example embodiment of the present invention to irradiate a beam containing information of a mask pattern onto a wafer.

FIG. 7 shows an example of an EUVL apparatus using the off-axis projection optics of FIGS. 1 and 2 according to an example embodiment of the present invention to irradiate a beam containing information of a mask pattern onto a wafer.

Referring to FIGS. 1, 2, and 7, a patterned reflective mask 100 and a wafer 110 may be respectively disposed at an object plane and an image plane. For example, an EUV beam irradiating the reflective mask 100 may be reflected from the reflective mask 100 to a first mirror 10. The EUV beam may be reflected by the first mirror 10, may be focused at a confocal point, and then may be diverged toward a second mirror 30. An incident beam is then reflected by the second mirror 30 and irradiates a wafer 110 to form a pattern corresponding to the reflective mask 100.

Off-axis projection optics of an example embodiment of the present invention may require at least two mirrors and may further include at least one mirror considering the installation positions and directions of a reflective mask 100 and a wafer 110 used in an EUVL apparatus.

While it is described above that off-axis projection optics of an example embodiment of the present invention is used in an EUVL apparatus, off-axis projection optics according to an example embodiment of the present invention may be applied to various other optical devices.

According to an example embodiment of the present invention, off-axis projection optics may reduce and/or remove linear astigmatism so that a reduced number of mirrors may be used to construct any system, which may reduce manufacturing costs and increase overall reflectance of an optical system when used in an EUVL apparatus. Off-axis projection optics of an example embodiment of the present invention having a high overall reflectance may also enable use of a low-power light source, for example, a low-power EUV light source.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. Off-axis projection optics comprising:

first and second mirrors positioned off-axis and sharing a confocal point that are arranged to reduce linear astigmatism, wherein a distance between an object plane and the first mirror is $l_1$, an incident angle of light coming from the object plane to the first mirror is $i_1$, a distance between the first mirror and the confocal point is $l_1'$, a distance between the confocal point and the second mirror is $l_2$, an incident angle of light coming from the first mirror to the second mirror is $i_2$, and a distance between the second mirror and an image plane is $l_2'$, the arrangement of the first and second mirrors satisfy the following $$\frac{l_1' + l_1}{l_1} \tan i_1 = \frac{l_2' + l_2}{l_2} \tan i_2.$$

2. The off-axis projection optics of claim 1, wherein the axes of parent mirrors of the first and second mirrors meet at the confocal point.

3. The off-axis projection optics of claim 1, wherein the number of a pair of first and second mirrors is at least one.

4. A lithography apparatus comprising:

a projection optics irradiating a beam containing information of a mask pattern onto a wafer, wherein the projection optics includes the off-axis projection optics of claim 1.

5. The apparatus of claim 4, wherein the axes of parent mirrors of the first and second mirrors meet at the confocal point.

6. The apparatus of claim 4, wherein the number of a pair of first and second mirrors is at least one.

7. The apparatus of claim 4, wherein the beam is an extreme ultraviolet (EUV) beam.

8. The apparatus of claim 4, wherein the mask is a reflective mask.

9. A lithography apparatus comprising:

first and second mirrors positioned off-axis and sharing a confocal point arranged to reduce linear astigmatism, wherein a distance between an object plane and the first mirror is $l_1$, an incident angle of light coming from the object plane to the first mirror is $i_1$, a distance between the first mirror and the confocal point is $l_1'$, a distance between the confocal point and the second mirror is $l_2$, an incident angle of light coming from the first mirror to the second mirror is $i_2$, and a distance between the second mirror and an image plane is $l_2'$, the arrangement of the first and second mirrors satisfy the following $$\frac{l_1' + l_1}{l_1} \tan i_1 = \frac{l_2' + l_2}{l_2} \tan i_2.$$

* * * * *